(12) United States Patent
Hiroi et al.

(10) Patent No.: US 10,756,190 B2
(45) Date of Patent: Aug. 25, 2020

(54) PRECURSOR COMPOSITION FOR FORMING AMORPHOUS METAL OXIDE SEMICONDUCTOR LAYER, AMORPHOUS METAL OXIDE SEMICONDUCTOR LAYER, METHOD FOR PRODUCING SAME, AND SEMICONDUCTOR DEVICE

(75) Inventors: Yoshiomi Hiroi, Funabashi (JP); Shinichi Maeda, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 13/811,586

(22) PCT Filed: Jul. 26, 2011

(86) PCT No.: PCT/JP2011/066950
§ 371 (c)(1),
(2), (4) Date: Jan. 22, 2013

(87) PCT Pub. No.: WO2012/014885
PCT Pub. Date: Feb. 2, 2012

(65) Prior Publication Data
US 2013/0140503 A1   Jun. 6, 2013

(30) Foreign Application Priority Data

Jul. 26, 2010   (JP) ................................. 2010-166778

(51) Int. Cl.
*H01L 29/24* (2006.01)
*C04B 35/01* (2006.01)
(Continued)

(52) U.S. Cl.
CPC ............ *H01L 29/247* (2013.01); *C04B 35/01* (2013.01); *C04B 35/453* (2013.01); *C04B 35/62625* (2013.01); *C04B 35/62675* (2013.01); *H01L 21/02554* (2013.01); *H01L 21/02565* (2013.01); *H01L 21/02592* (2013.01); *H01L 21/02628* (2013.01); *H01L 29/78693* (2013.01);
(Continued)

(58) Field of Classification Search
CPC . A61Q 5/10; A61Q 5/08; A61Q 5/065; A61K 8/19; A61K 8/494; H01B 1/08
USPC ....................................................... 252/518.1
See application file for complete search history.

(56) References Cited

U.S. PATENT DOCUMENTS 3,640,698 A * 2/1972 Backlund .......................... 71/29
3,647,416 A * 3/1972 Messman .......................... 71/29
(Continued)

FOREIGN PATENT DOCUMENTS

JP       A-2-92817        4/1990
JP       2001-156321 A    6/2001
(Continued)

OTHER PUBLICATIONS

Ebbing, D., and Wrighton, M., General Chemistry, 1984, p. 38.*
(Continued)

*Primary Examiner* — William D Young
(74) *Attorney, Agent, or Firm* — Oliff PLC

(57) ABSTRACT

The invention provides a precursor composition for forming an amorphous metal oxide semiconductor layer, containing a metal salt, a primary amide, and a water-based solution. An amorphous metal oxide semiconductor layer is formed by use of the composition.

8 Claims, 5 Drawing Sheets

(51) Int. Cl.
*H01L 21/02* (2006.01)
*H01L 29/786* (2006.01)
*C04B 35/626* (2006.01)
*C04B 35/453* (2006.01)

(52) U.S. Cl.
CPC ............ *C04B 2235/3284* (2013.01); *C04B 2235/3286* (2013.01); *C04B 2235/3293* (2013.01)

(56) References Cited

U.S. PATENT DOCUMENTS

| | | | | |
|---|---|---|---|---|
| 3,655,357 | A * | 4/1972 | Ray ..................................... | 71/1 |
| 3,753,675 | A * | 8/1973 | Young ................................ | 71/1 |
| 3,988,263 | A * | 10/1976 | Hansford ............. | B01D 53/864 |
| | | | | 502/332 |
| 4,113,658 | A * | 9/1978 | Geus ...................... | B01J 37/031 |
| | | | | 252/62.55 |
| 4,298,492 | A * | 11/1981 | van den Brom ............. | 510/372 |
| 5,478,789 | A * | 12/1995 | Hattori ..................... | B01J 23/78 |
| | | | | 502/244 |
| 2004/0256601 | A1 | 12/2004 | Hubacek et al. | |
| 2009/0206341 | A1* | 8/2009 | Marks ............... | H01L 21/02554 |
| | | | | 257/66 |
| 2010/0072435 | A1 | 3/2010 | Honda et al. | |

FOREIGN PATENT DOCUMENTS

| | | |
|---|---|---|
| JP | A-2004-139979 | 5/2004 |
| JP | 2010-010549 A | 1/2010 |
| JP | 2010-093164 A | 4/2010 |
| JP | A-2010-98303 | 4/2010 |
| WO | 2008/062693 A1 | 5/2008 |
| WO | WO 2009/081862 A1 | 7/2009 |
| WO | WO 2009/119968 A1 | 10/2009 |

OTHER PUBLICATIONS

Pasquarelli et al., "Solution Synthesis and Characterization of Indium—Zinc Formate Precursors for Transparent Conducting Oxides," *Inorg. Chem.*, 2010, vol. 49, pp. 5424-5431.

Kim et al., "Compositional influence on sol-gel-derived amorphous oxide semiconductor thin film transistors," *Applied Physics Letters*, 2009, vol. 95, 103501-1-103501-3.

Kim et al., "Effect of Metallic Composition on Electrical Properties of Solution-Processed Indium-Gallium-Zinc-Oxide Thin-Film Transistors," *IEEE Transactions on Electron Devices*, 2010, vol. 57, pp. 1009-1014.

Chen et al., "The Influence of Channel Compositions on the Electrical Properties of Solution-Processed Indium-Zinc Oxide Thin-Film Transistors," *Journal of Display Technology*, 2009, vol. 5, No. 12, pp. 509-514.

Hosono, "Transparent Oxide Functional Materials and the Application of the Same," CMC Publishing Co., Ltd., 2006, p. 126 (with partial translation).

Hosono, "Frontiers of Oxide Semiconductors," Complete Description, 2010, Electric Journal, 2010 pp. 1-5 (with partial translation).

International Search Report issued in International Patent Application No. PCT/JP2011/066950 dated Oct. 18, 2011.

Jan. 21, 2015 Office Action issued in Taiwanese Patent Application No. 104200818200.

ZnO Nanostructures for Dye-Sensitized Solar Cells; Advanced Materials; 2009, 21; pp. 4087-4108.

Aug. 5, 2015 Office Action issued in Japanese Application No. 2012-526511.

Apr. 25, 2016 Extended European Search Report issued in European Application No. 11812474.2.

* cited by examiner

PRECURSOR COMPOSITION FOR FORMING AMORPHOUS METAL OXIDE SEMICONDUCTOR LAYER, AMORPHOUS METAL OXIDE SEMICONDUCTOR LAYER, METHOD FOR PRODUCING SAME, AND SEMICONDUCTOR DEVICE

TECHNICAL FIELD

The present invention relates to a precursor composition for forming an amorphous metal oxide semiconductor layer through a variety of coating methods, to the amorphous metal oxide semiconductor layer formed by use of the composition, to a method for producing the amorphous metal oxide semiconductor layer, and to a semiconductor device having the semiconductor layer.

BACKGROUND ART

Non-Patent Documents 1 and 2 disclose thin film transistors each having an amorphous metal oxide semiconductor layer which has been formed through sputtering or CVD. In the case of formation of such an amorphous metal oxide semiconductor layer by means of a vacuum deposition type film-forming apparatus (e.g., a sputtering apparatus), pattern formation is generally performed through vapor deposition by the mediation of a mask or through photolithographic etching. These conventional techniques, however, have drawbacks, such as high cost when a large-scale substrate is used, and cumbersome manufacturing processes. Amorphous metal oxide semiconductor layers produced through these methods also have drawbacks in that quality varies among semiconductor layer products obtained on the same substrate and between the different substrates, and that high-temperature firing is required to reduce such quality variations.

Recently, Non-Patent Documents 3 to 6 and Patent Documents 1 to 3 have proposed production of thin film transistors which includes formation of a metal oxide semiconductor layer film through a coating technique.

In these production methods based on a coating technique, a metal complex is dissolved in a solvent to thereby form a precursor composition; the precursor composition is applied onto a substrate through a coating technique such as spin coating or ink-jet coating; and the coating is fired, whereby a metal oxide semiconductor layer is formed. However, when a substrate having low heat-resistance, such as a plastic substrate, is used, there occur thermal expansion and contraction or deterioration of the substrate, or decomposition of the substrate itself. In order to prevent such drawbacks, there is demand for a precursor composition which can form a dense amorphous metal oxide semiconductor layer at a low temperature which does not exceed 300° C.

Non-Patent Document 3 discloses a procedure of determining the optimum firing temperature. In this procedure, the pyrolysis behavior of a precursor composition is analyzed in advance through thermal analysis of the composition, whereby a firing temperature at which heat generation or heat absorption, which would otherwise be caused by thermal weight loss and/or thermal reaction, is selected. However, Non-Patent Document 4 discloses that, when such a precursor composition is not fired at a temperature sufficiently higher than the temperature at which the precursor composition undergoes thermal weight loss and/or thermal reaction, impurities remaining in the formed film affect the operational behavior of the resultant device, and the performance of the resultant device is lower than that of the same device employing a metal oxide semiconductor layer produced through vacuum deposition.

Patent Documents 1 and 3 disclose methods for producing a thin film semiconductor layer, the methods employing a low-boiling-point alcohol and water, instead of a high-boiling-point organic solvent, which may produce residual substances. However, a dense amorphous metal oxide semiconductor layer fails to be formed through the aforementioned methods.

Non-Patent Documents 5 and 6 disclose that a dense amorphous film fails to be formed by firing such a coating composition, concomitant with coating failures observed on the surface of the formed film. In order to overcome the drawback, there has been proposed an approach of limiting the ingredient concentration of the composition. However, even when the approach is employed, an amorphous metal oxide semiconductor layer having a sufficient thickness fails to be formed.

PRIOR ART DOCUMENTS

Patent Documents

Patent Document 1: WO2009/081862
Patent Document 2: WO2009/119968
Patent Document 3: Japanese Patent Application Laid-Open (kokai) No. 2010-098303

Non-Patent Documents

Non-Patent Document 1: Hideo HOSONO, "Transparent Oxide Functional Materials and the Application of the Same," CMC Publishing Co., Ltd., 2006
Non-Patent Document 2: Hideo HOSONO, Frontiers of Oxide Semiconductors, Complete Description 2010, Electronic Journal, 2010
Non-Patent Document 3: David S. Ginley, et al., "Solution Synthesis and Characterization of Indium-Zinc Formate Precursors for Transparent Conducting Oxides," Inorg. Chem. 49, 5424-5431, 2010
Non-Patent Document 4: Jooho Moon, et al., "Compositional influence on sol-gel-derived amorphous oxide semiconductor thin transistor," Appl. Phys. Lett. 95, 103501, 2009
Non-Patent Document 5: Sung Kyu Park, et al., "Effect of Metallic Composition on Electrical Properties of Solution-Processed Indium-Gallium-Zinc-Oxide Thin-Film Transistors," IEEE Transaction on Electron Devices, 57, No. 5, May, 2010
Non-Patent Document 6: Chung-Chih Wu, et al., "The Influence of Channel Compositions on the Electrical Properties of Solution-Processed Indium-Zinc-Oxide Thin-Film Transistors," Journal of Display Technology, 5, No. 12, December, 2009

SUMMARY OF THE INVENTION

Problems to be Solved by the Invention

An object of the present invention is to provide a precursor composition for forming an amorphous metal oxide semiconductor layer, which composition can provide a high-density amorphous metal oxide semiconductor layer through coating technique at low temperature in air. Another object is to provide an amorphous metal oxide semiconductor layer. Still another object is to provide a production method therefor. Yet another object is to provide a semiconductor device.

Means for Solving the Problems

Accordingly, in a first aspect of the present invention, there is provided a precursor composition for forming an amorphous metal oxide semiconductor layer, the composition comprising a metal salt, a primary amide, and a water-based solution.

A second aspect of the present invention is directed to a specific embodiment of the precursor composition for forming an amorphous metal oxide semiconductor layer of the first aspect, wherein the composition contains the primary amide in an amount of 0.1 to 100 mass % with respect to the amount of the metal salt.

A third aspect of the present invention is directed to a specific embodiment of the precursor composition for forming an amorphous metal oxide semiconductor layer of the first or second aspect, wherein the primary amide is a compound represented by the following formula (I):

[F1]

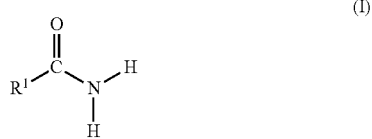

(I)

(wherein $R^1$ represents a hydrogen atom; a C1 to C6 branched or linear alkyl group; an oxygen atom to which a hydrogen atom or a C1 to C6 branched or linear alkyl group is bonded; or a nitrogen atom to which a hydrogen atom, an oxygen atom, or a C1 to C6 branched or linear alkyl group is bonded).

A fourth aspect of the present invention is directed to a specific embodiment of the precursor composition for forming an amorphous metal oxide semiconductor layer of any one of the first to third aspects, wherein the metal of the metal salt is at least one species selected from the group consisting of Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Cd, In, Ir, Sn, Sb, Cs, Ba, La, Hf, Ta, W, Ti, Pb, Bi, Ce, Pr, Nd, Pm, Eu, Gd, Tb, Dy, Ho, Er, Tm, Yb, and Lu.

A fifth aspect of the present invention is directed to a specific embodiment of the precursor composition for forming an amorphous metal oxide semiconductor layer of any one of the first to fourth aspects, wherein the metal salt is an inorganic acid salt.

A sixth aspect of the present invention is directed to a specific embodiment of the precursor composition for forming an amorphous metal oxide semiconductor layer of the fifth aspect, wherein the inorganic acid salt is at least one species selected from the group consisting of a nitrate salt, a sulfate salt, a phosphate salt, a carbonate salt, a hydrogencarbonate salt, a borate salt, a hydrochloride salt, and a hydrofluoride salt.

A seventh aspect of the present invention is directed to a specific embodiment of the precursor composition for forming an amorphous metal oxide semiconductor layer of any one of the first to sixth aspects, which is acidic.

An eighth aspect of the present invention is directed to a specific embodiment of the precursor composition for forming an amorphous metal oxide semiconductor layer of the seventh aspect, which has a pH of 1 to 3.

In a ninth aspect of the present invention, there is provided a method for producing the amorphous metal oxide semiconductor layer, characterized in that the method comprises applying a precursor composition for forming an amorphous metal oxide semiconductor layer as recited in any one of the first to eighth aspects, to thereby form a precursor film, and firing the film at a temperature of 150° C. or higher and lower than 300° C.

In a tenth aspect of the present invention, there is provided an amorphous metal oxide semiconductor layer produced through a method for producing the amorphous metal oxide semiconductor layer as recited in the ninth aspect.

In an eleventh aspect of the present invention, there is provided a semiconductor device having an amorphous metal oxide semiconductor layer as recited in the tenth aspect.

Effects of the Invention

The precursor composition of the present invention for forming an amorphous metal oxide semiconductor layer, which composition comprises a metal salt, a primary amide, and a water-based solution, is capable of forming a dense amorphous metal oxide semiconductor layer through a coating technique at low temperature under atmospheric pressure. By use of the precursor composition for forming an amorphous metal oxide semiconductor layer, a dense amorphous metal oxide semiconductor layer can be formed through firing at low temperature, whereby a semiconductor device having the amorphous metal oxide semiconductor layer can be fabricated.

MODES FOR CARRYING OUT THE INVENTION

Figure 1:
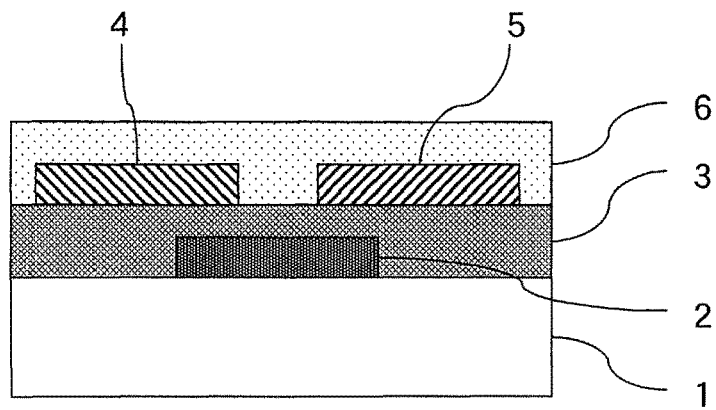
FIG. 1 A schematic cross-sectional view showing an example of the structure of a thin film transistor.

The precursor composition of the present invention for forming an amorphous metal oxide semiconductor layer (hereinafter may be referred to simply as "precursor composition") contains a metal salt, a primary amide, and a water-based solvent. The primary amide content is 0.1 to 100 mass %, preferably 5 to 50 mass %, with respect to the metal salt.

Examples of the primary amide contained in the precursor composition of the present invention for forming an amorphous metal oxide semiconductor layer include compounds represented by the following formula (I):

[F2]

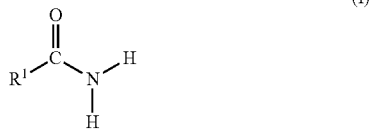

(I)

(wherein $R^1$ represents a hydrogen atom; a C1 to C6 branched or linear alkyl group; an oxygen atom to which a hydrogen atom or a C1 to C6 branched or linear alkyl group is bonded; or a nitrogen atom to which a hydrogen atom, an oxygen atom, or a C1 to C6 branched or linear alkyl group is bonded). Examples of the "oxygen atom to which a hydrogen atom or a C1 to C6 branched or linear alkyl group is bonded" include —OH or —$OR^2$ (wherein $R^2$ is a C1 to C6 branched or linear alkyl group). Examples of the "nitrogen atom to which a hydrogen atom, an oxygen atom, or a C1 to C6 branched or linear alkyl group is bonded" include —$NH_2$, —$NHR^3$, and —$NR^4R^5$ (wherein each of $R^3$, $R^4$ and $R^5$ represents a C1 to C6 branched or linear alkyl group).

Specific examples of the primary amide include acetamide, acetylurea, acrylamide, adipamide, acetaldehyde, semicarbazone, azodicarbonamide, 4-amino-2,3,5,6-tetrafluorobenzamide, β-alaninamide hydrochloride, L-alaninamide hydrochloride, benzamide, benzylurea, biurea, biuret, butylamide, 3-bromopropionamide, butylurea, 3,5-bis(trifluoromethyl)benzamide, tert-butyl carbamate, hexanamide, ammonium carbamate, ethyl carbamate, 2-chloroacetamide, (2-chloroethyl)urea, crotonamide, 2-cyanoactamide, butyl carbamate, isopropyl carbamate, methyl carbamate, cyanoacetylurea, cyclopropanecarboxamide, cyclohexylurea, 2,2-dichloroacetamide, dicyandiamidine phosphate, guanylurea sulfate, 1,1-dimethylurea, 2,2-dimethoxypropyonamide, ethylurea, fluoroacetamide, formamide, fumaramide, glycinamide hydrochloride, hydroxyurea, hydantoic acid, 2-hydroxyethylurea, heptafluorobutylamide, 2-hydroxyisobutylamide, isobutylamide, lactamide, maleamide, malonamide, 1-methylurea, nitrourea, oxamic acid, ethyl oxamate, oxamide, oxamic hydrazide, butyl oxamate, phenylurea, phthalamide, propionamide, pivalacetamide, pentafluorobenzamide, pentafluoropropionamide, semicarbazide hydrochloride, succinamide, trichloroacetamide, trifluoroacetamide, urea nitrate, urea, and valeramide. Among them, formamide, urea, and ammonium carbamate are preferred. These species may be used singly or in combination of two or more species.

The metal of the metal salt contained in the precursor composition of the present invention forming an amorphous metal oxide semiconductor layer is, for example, at least one member selected from the group consisting of Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Cd, In, Ir, Sn, Sb, Cs, Ba, La, Hf, Ta, W, Tl, Pb, Bi, Ce, Pr, Nd, Pm, Eu, Gd, Tb, Dy, Ho, Er, Tm, Yb, and Lu. Among these metals, any of indium (In), tin (Sn), and zinc (Zn) is preferably contained in the precursor composition. More preferably, gallium (Ga) or aluminum (Al) may be contained in the composition.

Examples of the amorphous metal oxide semiconductor produced from the precursor composition of the present invention for forming an amorphous metal oxide semiconductor layer include indium gallium zinc oxide, indium gallium oxide, indium tin zinc oxide, gallium zinc oxide, indium tin oxide, indium zinc oxide, tin zinc oxide, zinc oxide, and tin oxide. Specific examples include $InGaZnO_x$, $InGaO_x$, $InSnZnO_x$, $GaZnO_x$, $InSnO_x$, $InZnO_x$, $SnZnO_x$ (wherein X>0 in any case), ZnO, and $SnO_2$.

The metal salt employed in the composition is preferably an inorganic acid salt. Examples of the inorganic acid salt which may be employed in the composition include at least one member selected from the group consisting of a nitrate, a sulfate, a phosphate, a carbonate, a hydrogencarbonate, a borate, a hydrochloride, and a hydrofluoride. The inorganic salt is preferably a hydrochloride and a nitrate, for carrying out heat treatment (firing) at a low temperature after application.

In the case where the precursor composition of the present invention for forming an amorphous metal oxide semiconductor layer contains a plurality of metal elements, no particular limitation is imposed on the compositional proportions among the metal elements, so long as a target amorphous metal oxide semiconductor layer can be formed. The proportions by mole among a metal (Metal A) contained in a salt selected from metal salts of In or Sn; a metal (Metal B) contained in a salt selected from metal salts of Zn; and a metal (Metal C) contained in a salt selected from metal salts of Ga or Al are preferably 1:0.05 to 1:0 to 1 (Metal A: Metal B:Metal C). Since the metal salt is most preferably a nitrate salt, nitrates of the source metals are dissolved in a water-based solvent (described in detail hereinafter), so that the compositional proportions by mole Metal A:Metal B:Metal C are adjusted to 1:0.05 to 1:0 to 1. Then, a primary amide represented in formula (I) or the like is added to the aqueous metal nitrate solution.

The solvent employed in the precursor composition of the present invention for forming an amorphous metal oxide semiconductor layer is a water-based solvent. That is, the solvent contains water, as a predominant component, in an amount of 50 mass % or more. So long as water is a predominant component, water or a mixture of water and an organic solvent may also be used as the solvent. Specific examples of the organic solvent to be added to water include propyleneglycol monomethyl ether, propyleneglycol monomethylethyl ether acetate, propyleneglycol monopropyl ether, methylethyl ketone, ethyl lactate, cyclohexanone, γ-butyrolactone, N-methylpyrrolidone, formamide, N,N-dimethylformamide, N,N-dimethylacetamide, N-methyl-2-2-pyrrolidone, N-methylcaprolactam, dimethyl sulfoxide, tetramethylurea, pyridine, dimethyl sulfone, hexamethyl sulfoxide, methanol, ethanol, 1-propanol, isopropanol, n-butanol, 2-butanol, tert-butanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2-dimethyl-3-pentanol, 2,3-dimethyl-3-pentanol, 2,4-dimethyl-3-pentanol, 4,4-dimethyl-2-pentanol, 3-ethyl-3-pentanol, 1-heptanol, 2-heptanol, 3-heptanol, 2-methyl-2-hexanol, 2-methyl-3-hexanol, 5-methyl-1-hexanol, 5-methyl-2-hexanol, 2-ethyl-1-hexanol, 4-methyl-3-heptanol, 6-methyl-2-heptanol, 1-octanol, 2-octanol, 3-octanol, 2-propyl-1-pentanol, 2,4,4-trimethyl-1-pentanol, 2,6-dimethyl-4-heptanol, 3-ethyl-2,2-dimethyl-pentanol, 1-nonanol, 2-nonanol, 3,5,5-trimethyl-1-hexanol, 1-decanol, 2-decanol, 4-decanol, 3,7-dimethyl-1-octanol, and 3,7-dimethyl-3-octanol. These organic solvents may be used in combination of two or more species.

The solid content of the precursor composition of the present invention for forming an amorphous metal oxide semiconductor layer is 0.1 mass % or more, preferably 0.3 mass % or more, more preferably 0.5 mass % or more. Also, the solid content of the precursor composition of the present invention for forming an amorphous metal oxide semiconductor layer is 30.0 mass % or less, preferably 20.0 mass % or less, more preferably 15.0 mass % or less. As used herein, the term "solid content" refers to the sum of the metal salt content and the primary amide content.

The precursor composition of the present invention for forming an amorphous metal oxide semiconductor layer is preferably acidic. Specifically, the precursor composition of the present invention for forming an amorphous metal oxide semiconductor layer preferably has a pH of 1 to 3. For lowering the pH, there may be used at least one acid selected from the group consisting of nitric acid, sulfuric acid, phosphoric acid, carbonic acid, boric acid, hydrochloric acid, and hydrofluoric acid.

No particular limitation is imposed on the method for producing the precursor composition of the present invention for forming an amorphous metal oxide semiconductor layer. In one production method, a metal salt and a primary amide are mixed with a water-based solvent.

Through application of the precursor composition of the present invention for forming an amorphous metal oxide semiconductor layer onto a substrate to form a precursor thin film, and thereafter firing the thin film at a low temperature (e.g., 150° C. or higher and lower than 300° C.), an amorphous metal oxide semiconductor layer having high density can be produced. Before the firing step, a drying process is preferably carried out as a preliminary treatment at a temperature of 50° C. or higher and lower than 150° C. so as to remove remaining solvent.

The precursor composition for forming an amorphous metal oxide semiconductor layer may be applied through a known coating method. Examples of the coating method include spin-coating, dip-coating, screen printing, roll coating, ink-jet coating, die coating, transfer printing, spraying, and slit coating. The thickness of the precursor thin film is 1 nm to 1 µm, preferably 10 to 100 nm, the precursor thin film having been formed by applying the precursor composition through any of the above coating methods. In the case where a thickness of interest cannot be attained through a single application/firing procedure, the application/firing step may be repeatedly performed until the thickness of interest is realized.

Generally, for forming the amorphous metal oxide semiconductor layer, the above-applied precursor thin film is required to be fired. In contrast, However, the precursor composition of the present invention for forming an amorphous metal oxide semiconductor layer can provide a dense amorphous metal oxide semiconductor layer even at a temperature lower than a conventionally required firing temperature of 300° C. or higher.

The firing of the precursor thin film corresponds to a step of oxidizing the metal salt. The firing temperature is preferably 150° C. or higher and lower than 300° C., more preferably 150° C. or higher and lower than 275° C. Needless to say, even when the firing is carried out at 300° C. or higher (and 500° or less), an amorphous metal oxide semiconductor layer can be produced. No particular limitation is imposed on the firing time, but the firing time is, for example, 3 minutes to 24 hours.

Through carrying out the firing step, the amorphous metal oxide semiconductor layer can be formed. No particular limitation is imposed on the thickness of the amorphous metal oxide semiconductor layer, but it is, for example, 5 to 100 nm.

Meanwhile, Patent Document 1 or the like discloses means for firing a precursor thin film at a firing (annealing) temperature of lower than 300° C. by means of an atmospheric plasma apparatus or a microwave heating apparatus, to thereby to form a corresponding semiconductor layer. However, these apparatuses are expensive and are not generally employed. Therefore, there is demand for a technique of producing a semiconductor layer through firing at a temperature lower than 300° C. by means of an inexpensive and generally employable apparatus (e.g., a hot plate, an IR furnace, or an oven). When the precursor composition of the present invention for forming an amorphous metal oxide semiconductor layer is used, a high-quality amorphous metal oxide semiconductor layer can be produced through firing at a temperature lower than 300° C. by means of an inexpensive and generally employable heating device (e.g., a hot plate, an IR furnace, or an oven). Specifically, the firing step may be carried out by means of a hot plate, an IR furnace, an oven, or the like.

The precursor thin film may be fired not only in an oxidizing atmosphere (e.g., air or oxygen), but also in an inert gas (e.g., nitrogen, helium, or argon).

No particular limitation is imposed on the substrate on which the precursor thin film is formed. Examples of the substrate include a silicon substrate, a metal substrate, a gallium substrate, a transparent electrode substrate, an organic thin film substrate, a plastic substrate, and a glass substrate. More specific examples of the substrate include a film of a plastic material such as polyimide, polycarbonate, polyethylene terephthalate, polyethylene naphthalate; a stainless steel foil substrate; and a glass substrate. Alternatively, there may also be used a semiconductor substrate on which a circuit element such as a wiring layer and/or a transistor has been provided.

The semiconductor device according to the present invention has an amorphous metal oxide semiconductor layer which is produced through a method including applying the precursor composition of the present invention for forming the amorphous metal oxide semiconductor layer onto a substrate, to thereby form a precursor thin film, and firing the thin film at low temperature.

The semiconductor device of the present invention having the amorphous metal oxide semiconductor layer of the present invention has a lower limit of electron carrier concentration of $10^{12}/cm^3$. The electron carrier concentration can be regulated through modifying the composition (constituent elements) of the amorphous metal oxide, compositional proportions, production conditions, and the like. The lower limit of the electron carrier concentration limit is $10^{12}/cm^3$ or more, preferably $10^{13}/cm^3$ or more. The upper limit of the electron carrier concentration is $10^{18}/cm^3$ or less.

Figure 2:
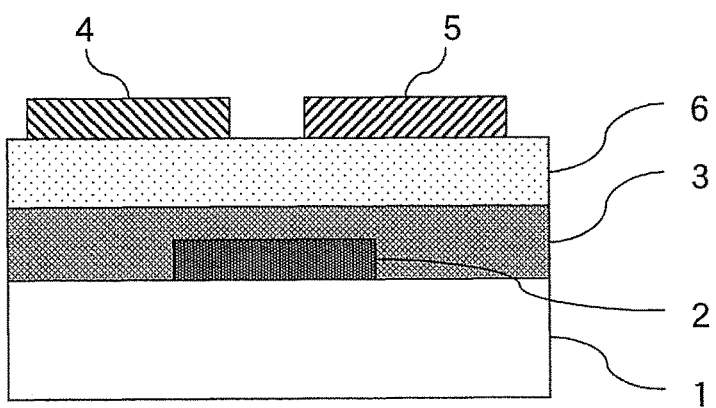
FIG. 2 A schematic cross-sectional view showing another example of the structure of the thin film transistor.
Figure 3:
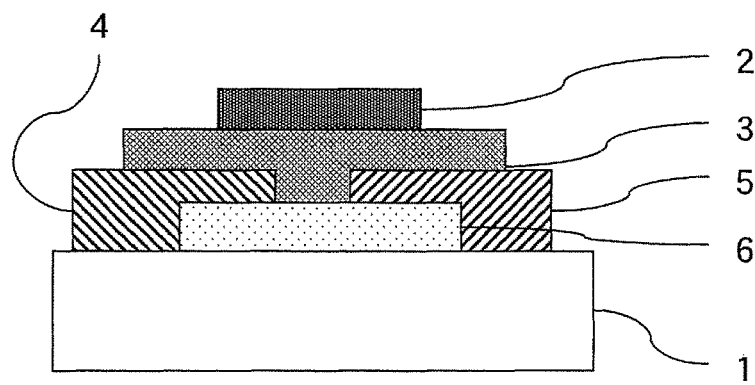
FIG. 3 A schematic cross-sectional view showing still another example of the structure of the thin film transistor.

One embodiment of the semiconductor device of the present invention having the amorphous metal oxide semiconductor layer is a thin film transistor. No particular limitation is imposed on the configuration of the thin film transistor, so long as the thin film transistor has the amorphous metal oxide semiconductor layer as mentioned above. FIGS. 1 to 3 show embodiments of the thin film transistor employing the amorphous metal oxide semiconductor layer of the present invention.

In embodiments shown in FIGS. 1 and 2, the thin film transistor of the present invention has a gate electrode 2 formed on a substrate 1, and the gate electrode 2 is covered with a gate insulating film 3. In the embodiment shown in FIG. 1, a source electrode 4 and a drain electrode 5 are disposed on the gate insulating film 3, and an amorphous metal oxide semiconductor layer 6 falling within a scope of the present invention is disposed so as to cover the source electrode 4 and the drain electrode 5. In the embodiment shown in FIG. 2, the amorphous metal oxide semiconductor layer 6 is formed on a gate insulating film 3, and a source electrode 4 and a drain electrode 5 are disposed on the semiconductor layer 6. In the embodiment shown in FIG. 3, the amorphous metal oxide semiconductor layer 6 is formed on a substrate 1, and the source electrode 4 and the drain electrode 5 are disposed so as to cover the amorphous metal oxide semiconductor layer 6 and the substrate 1. The gate insulating film 3 is formed on the amorphous metal oxide semiconductor layer 6, the source electrode 4, and the drain electrode 5, and the gate electrode 2 is disposed on the gate insulating film 3.

Examples of the electrode material employed for producing the thin film transistor (the material of the gate electrode 2, the source electrode 4, and the drain electrode 5) include metals such as gold, silver, copper, aluminum, molybdenum, and titanium; inorganic materials such as ITO, IZO, carbon black, fullerenes, or carbon nanotubes; and organic π-conjugated polymers such as polythiophene, polyaniline, polypyrrole, polyfluorene, and derivatives thereof. These electrode materials may be used singly or in combination of two or more members for enhancing the electron field-effect mobility and ON/OFF ratio of the thin film transistor, or regulating the threshold voltage of the transistor. The gate electrode, the source electrode, and the drain electrode may be formed of different materials.

Examples of the gate insulating film 3 include inorganic insulating films such as silicon oxide film, silicon nitride film, aluminum oxide film, hafnium oxide film, and yttrium oxide film; and organic insulating films such as polyimide film, polymethylmethacrylate film, polyvinylphenol film, and benzocyclobutene film. These gate insulating films may be used singly or in combination of two or more members for enhancing the electron field-effect mobility and ON/OFF ratio of the thin film transistor, or regulating the threshold voltage of the transistor.

Examples of the substrate 1 include the same substrates as employed for forming the aforementioned precursor thin film.

Generally, the gate electrode 2, the source electrode 4, and the drain electrode 5 are formed through vacuum deposition, sputtering, or a similar technique.

Alternatively, a coating method such as spray coating, printing, or ink-jet coating may be also employed for simplifying the production method. Also, the gate insulating film 3 is generally formed through vacuum deposition, sputtering, or the like. Alternatively, a coating method such as spray coating, printing, or ink-jet coating may be also employed for simplifying the production method. When the material is silicon, the gate insulating film 3 may be formed through thermal oxidation.

EXAMPLES

Example 1

Indium(III) nitrate trihydrate (0.36 g) (product of Aldrich, 99.999% trace metals basis), zinc nitrate hexahydrate (0.10 g) (product of Aldrich, 99.999% trace metals basis), and urea (0.05 g) (product of Kanto Chemical Industry CO., LTD, Guaranted reagent for JIS, 99.0%) were added to ultra-pure water (4.50 g), and the mixture was stirred until the mixture became completely transparent, to thereby form an aqueous solution. The solution was employed as a precursor composition 1. The precursor composition 1 was found to have a pH of 2.0. The precursor composition 1 was applied onto an alkali-free glass substrate through spin coating, and the substrate was exposed at room temperature for 30 seconds. The applied precursor composition was dried in air at 150° C. by means of a hot plate for 5 minutes and then fired at 300° C. for 15 minutes by means of the hot plate.

Example 2

Indium(III) nitrate trihydrate (0.36 g) (product of Aldrich, 99.999% trace metals basis), zinc nitrate hexahydrate (0.10 g) (product of Aldrich, 99.999% trace metals basis), and formamide (0.05 g) (product of Tokyo Chemical Industry CO., LTD, 98.5%) were added to ultra-pure water (4.50 g), and the mixture was stirred until the mixture became completely transparent, to thereby form an aqueous solution. The solution was employed as a precursor composition 2. The precursor composition 2 was found to have a pH of 2.2. The precursor composition 2 was applied onto an alkali-free glass substrate through spin coating, and the substrate was exposed at room temperature for 30 seconds. The applied precursor composition 2 was dried in air at 150° C. by means of a hot plate for 5 minutes and then fired at 300° C. for 15 minutes by means of the hot plate.

Example 3

Indium(III) nitrate trihydrate (0.36 g) (product of Aldrich, 99.999% trace metals basis), zinc nitrate hexahydrate (0.10 g) (product of Aldrich, 99.999% trace metals basis), and urea (0.05 g) (product of Kanto Chemical Industry CO., LTD, Guaranted reagent for JIS, 99.0%) were added to a blended solution of ultra-pure water (4.28 g) and ethanol (0.23 g) to provide a mixture, and the mixture was stirred until the mixture became completely transparent, to thereby form an aqueous solution. The solution was employed as a precursor composition 3. The precursor composition 3 was found to have a pH of 2.0. The precursor composition 3 was applied onto an alkali-free glass substrate through spin coating, and the substrate was exposed at room temperature for 30 seconds. The applied precursor composition 3 was dried in air at 150° C. by means of a hot plate for 5 minutes and then fired at 300° C. for 15 minutes by means of the hot plate.

Example 4

Indium(III) nitrate trihydrate (0.27 g) (product of Aldrich, 99.999% trace metals basis), zinc nitrate hexahydrate (0.08 g) (product of Aldrich, 99.999% trace metals basis), gallium (III) nitrate octahydrate (0.10 g) (product of Aldrich, 99.999% trace metals basis), and urea (0.05 g) (product of Kanto Chemical Industry CO., LTD, Guaranted reagent for JIS, 99.0%) were added to ultra-pure water (4.50 g), and the mixture was stirred until the mixture became completely transparent, to thereby form an aqueous solution. The solution was employed as a precursor composition 4. The precursor composition 4 was found to have a pH of 2.2. The precursor composition 4 was applied onto an alkali-free glass substrate through spin coating, and the substrate was exposed at room temperature for 30 seconds. The applied precursor composition 4 was dried in air at 150° C. by means of a hot plate for 5 minutes and then fired at 290° C. for 15 minutes by means of the hot plate.

Example 5

Indium(III) nitrate trihydrate (0.27 g) (product of Aldrich, 99.999% trace metals basis), zinc nitrate hexahydrate (0.08 g) (product of Aldrich, 99.999% trace metals basis), gallium (III) nitrate octahydrate (0.10 g) (product of Aldrich, 99.999% trace metals basis), and urea (0.05 g) (product of Kanto Chemical Industry CO., LTD, Guaranteed reagent for JIS, 99.0%) were added to a blended solution of ultra-pure water (4.28 g) and ethanol (0.23 g) to provide a mixture, and the mixture was stirred until the mixture became completely transparent, to thereby form an aqueous solution. The solution was employed as a precursor composition 5. The precursor composition 5 was found to have a pH of 2.2. The precursor composition 5 was applied onto an alkali-free glass substrate through spin coating, and the substrate was exposed at room temperature for 30 seconds. The applied precursor composition 5 was dried in air at 150° C. by means of a hot plate for 5 minutes and then fired at 300° C. for 15 minutes by means of the hot plate.

Example 6

Indium(III) nitrate trihydrate (0.36 g) (product of Aldrich, 99.999% trace metals basis), zinc nitrate hexahydrate (0.10 g) (product of Aldrich, 99.999% trace metals basis), and formamide (0.05 g) (product of Tokyo Chemical Industry CO., LTD, 98.5%) were added to a blended solution of ultra-pure water (4.28 g) and ethanol (0.23 g) to provide a mixture, and the mixture was stirred until the mixture became completely transparent, to thereby form an aqueous solution. The solution was employed as a precursor composition 6. The precursor composition 6 was found to have a pH of 2.0. The precursor composition 6 was applied onto an alkali-free glass substrate through spin coating, and the substrate was exposed at room temperature for 30 seconds. The applied precursor composition 6 was dried in air at 150° C. by means of a hot plate for 5 minutes and then fired at 300° C. for 15 minutes by means of the hot plate.

Example 7

Indium(III) nitrate trihydrate (0.27 g) (product of Aldrich, 99.999% trace metals basis), zinc nitrate hexahydrate (0.08 g) (product of Aldrich, 99.999% trace metals basis), gallium (III) nirate octahydrate (0.10 g) (product of Aldrich, 99.999% trace metals basis), and formamide (0.05 g) (product of Tokyo Chemical Industry CO., LTD, 98.5%) were added to ultra-pure water (4.50 g) to provide a mixture, and the mixture was stirred until the mixture became completely transparent, to thereby form an aqueous solution. The solution was employed as a precursor composition 7. The precursor composition 7 was found to have a pH of 2.2. The precursor composition 7 was applied onto an alkali-free glass substrate through spin coating, and the substrate was exposed at room temperature for 30 seconds. The applied precursor composition 7 was dried in air at 150° C. by means of a hot plate for 5 minutes and then fired at 300° C. for 15 minutes by means of the hot plate.

Example 8

Figure 4:
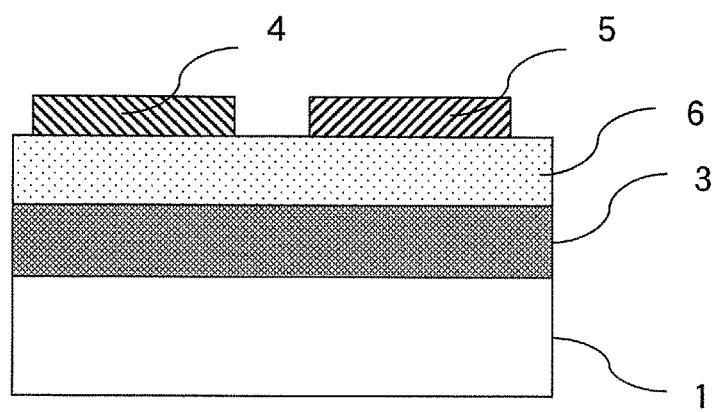
FIG. 4 A schematic cross-sectional view showing an example of the structure of thin film transistors produced in the Examples and the Comparative Examples.

A p-type over-doped silicon wafer product (resistance: ≤0.02 Ω·cm, having a thermal oxidation film (200 nm), product of KTS World), in which a thermal oxidation film (SiO$_2$, gate insulation film 3) was formed on a silicon wafer substrate 1, was cleaned by means of a UV ozonizer at 1,500 mJ/cm$^2$. Notably, the silicon wafer product also serves as a gate electrode. The precursor composition 1 was applied onto the gate insulation film on the substrate 1 through spin coating such that the thickness of the coating after firing was adjusted to 10 nm, dried in air at 150° C. for 5 minutes by means of a hot plate, and fired at 300° C. for 60 minutes by means of the hot plate, to thereby form an amorphous metal oxide semiconductor layer 6. On the thus-formed amorphous metal oxide semiconductor layer 6, an aluminum electrode was formed through vacuum deposition via a shadow mask so as to attain a channel length of 90 μm, a channel width of 2,000 μm, and a film thickness of 100 nm. The two points of the aluminum electrode were employed as a source electrode 4 and a drain electrode 5, respectively. Separately, the thermal oxidation film on the substrate 1 was partially scratched out by means of a diamond cutter, and the thus-exposed portion was employed as a gate electrode, to thereby fabricate a thin-film transistor. FIG. 4 schematically shows a cross-section of the structure of the thin-film transistor.

Example 9

The same stacked structure (i.e., the aforementioned silicon wafer product) as employed in Example 8 was cleaned by means of a UV ozonizer at 1,500 mJ/cm$^2$. The precursor composition 2 was applied onto the gate insulation film on the substrate through spin coating such that the thickness of the coating after firing was adjusted to 10 nm, dried in air at 150° C. for 5 minutes by means of a hot plate, and fired at 300° C. for 60 minutes by means of the hot plate, to thereby form an amorphous metal oxide semiconductor layer. Thereafter, the same procedure as employed in Example 8 was carried out, to thereby fabricate a thin-film transistor.

Example 10

The same stacked structure as employed in Example 8 was cleaned by means of a UV ozonizer at 1,500 mJ/cm$^2$. The precursor composition 3 was applied onto the gate insulation film on the substrate through spin coating such that the thickness of the coating after firing was adjusted to 10 nm, dried in air at 150° C. for 5 minutes by means of a hot plate, and fired at 300° C. for 60 minutes by means of the hot plate, to thereby form an amorphous metal oxide semiconductor layer. Thereafter, the same procedure as employed in Example 8 was carried out, to thereby fabricate a thin-film transistor.

Example 11

The same stacked structure as employed in Example 8 was cleaned by means of a UV ozonizer at 1,500 mJ/cm$^2$. The precursor composition 6 was applied onto the gate insulation film on the substrate through spin coating such that the thickness of the coating after firing was adjusted to 10 nm, dried in air at 150° C. for 5 minutes by means of a hot plate, and fired at 300° C. for 60 minutes by means of the hot plate, to thereby form an amorphous metal oxide semiconductor layer. Thereafter, the same procedure as employed in Example 8 was carried out, to thereby fabricate a thin-film transistor.

Example 12

The same stacked structure as employed in Example 8 was cleaned by means of a UV ozonizer at 1,500 mJ/cm$^2$.

The precursor composition 7 was applied onto the gate insulation film on the substrate through spin coating such that the thickness of the coating after firing was adjusted to 10 nm, dried in air at 150° C. for 5 minutes by means of a hot plate, and fired at 300° C. for 60 minutes by means of the hot plate, to thereby form an amorphous metal oxide semiconductor layer. Thereafter, the same procedure as employed in Example 8 was carried out, to thereby fabricate a thin-film transistor.

Example 13

The same stacked structure as employed in Example 8 was cleaned by means of a UV ozonizer at 1,500 mJ/cm$^2$. The precursor composition 2 was applied onto the gate insulation film on the substrate through spin coating such that the thickness of the coating after firing was adjusted to 10 nm, dried in air at 150° C. for 5 minutes by means of a hot plate, and fired at 275° C. for 12 hours by means of the hot plate, to thereby form an amorphous metal oxide semiconductor layer. Thereafter, the same procedure as employed in Example 8 was carried out, to thereby fabricate a thin-film transistor.

Example 14

The same stacked structure as employed in Example 8 was cleaned by means of a UV ozonizer at 1,500 mJ/cm$^2$. The precursor composition 6 was applied onto the gate insulation film on the substrate through spin coating such that the thickness of the coating after firing was adjusted to 10 nm, dried in air at 150° C. for 5 minutes by means of a hot plate, and fired at 275° C. for 12 hours by means of the hot plate, to thereby form an amorphous metal oxide semiconductor layer. Thereafter, the same procedure as employed in Example 8 was carried out, to thereby fabricate a thin-film transistor.

Example 15

The same stacked structure as employed in Example 8 was cleaned by means of a UV ozonizer at 1,500 mJ/cm$^2$. The precursor composition 1 was applied onto the gate insulation film on the substrate through spin coating such that the thickness of the coating after firing was adjusted to 10 nm, dried in air at 150° C. for 5 minutes by means of a hot plate, and fired at 250° C. for 24 hours by means of the hot plate, to thereby form an amorphous metal oxide semiconductor layer. Thereafter, the same procedure as employed in Example 8 was carried out, to thereby fabricate a thin-film transistor.

Example 16

The same stacked structure as employed in Example 8 was cleaned by means of a UV ozonizer at 1,500 mJ/cm$^2$. The precursor composition 2 was applied onto the gate insulation film on the substrate through spin coating such that the thickness of the coating after firing was adjusted to 10 nm, dried in air at 150° C. for 5 minutes by means of a hot plate, and fired at 250° C. for 24 hours by means of the hot plate, to thereby form an amorphous metal oxide semiconductor layer. Thereafter, the same procedure as employed in Example 8 was carried out, to thereby fabricate a thin-film transistor.

Example 17

The same stacked structure as employed in Example 8 was cleaned by means of a UV ozonizer at 1,500 mJ/cm$^2$. The precursor composition 6 was applied onto the gate insulation film on the substrate through spin coating such that the thickness of the coating after firing was adjusted to 10 nm, dried in air at 150° C. for 5 minutes by means of a hot plate, and fired at 250° C. for 24 hours by means of the hot plate, to thereby form an amorphous metal oxide semiconductor layer. Thereafter, the same procedure as employed in Example 8 was carried out, to thereby fabricate a thin-film transistor.

Comparative Example 1

Indium(III) nitrate trihydrate (0.27 g) (product of Aldrich, 99.999% trace metals basis), and zinc nitrate hexahydrate (0.08 g) (product of Aldrich, 99.999% trace metals basis) were added to ultra-pure water (4.50 g), and the mixture was stirred until the mixture became completely transparent, to thereby form an aqueous solution. The solution was employed as a precursor composition R1. The precursor composition R1 was found to have a pH of 1.9. The precursor composition R1 was applied onto an alkali-free glass substrate through spin coating, and the substrate was exposed at room temperature for 30 seconds. The applied precursor composition was dried in air at 150° C. by means of a hot plate for 5 minutes and then fired at 300° C. for 15 minutes by means of the hot plate.

Comparative Example 2

Indium(III) nitrate trihydrate (0.27 g) (product of Aldrich, 99.999% trace metals basis), and zinc nitrate hexahydrate (0.08 g) (product of Aldrich, 99.999% trace metals basis) were added to 2-methoxyethanol (4.50 g) (product of Tokyo Chemical Industry CO., LTD, 99.0%), and the mixture was stirred until the mixture became completely transparent, to thereby form a solution. The solution was employed as a precursor composition R2. The pH of the precursor composition R2 could not be determined due to the precursor composition R2 being an organic solvent composition. The precursor composition R2 was applied onto an alkali-free glass substrate through spin coating, and the substrate was exposed at room temperature for 30 seconds. The applied precursor composition R2 was dried in air at 150° C. by means of a hot plate for 5 minutes and then fired at 300° C. for 15 minutes by means of the hot plate.

Comparative Example 3

Indium(III) nitrate trihydrate (0.27 g) (product of Aldrich, 99.999% trace metals basis) and zinc nitrate hexahydrate (0.08 g) (product of Aldrich, 99.999% trace metals basis) were added to ethanol (4.50 g) (product of Kanto Chemical Industry CO., LTD, Guaranted reagent for JIS, 99.5%), and the mixture was stirred until the mixture became completely transparent, to thereby form a solution. The solution was employed as a precursor composition R3. The pH of the precursor composition R3 could not be determined due to the precursor composition R3 being an organic solvent composition. The precursor composition R3 was applied onto an alkali-free glass substrate through spin coating, and the substrate was exposed at room temperature for 30 seconds. The applied precursor composition R3 was dried in air at 150° C. by means of a hot plate for 5 minutes and then fired at 300° C. for 15 minutes by means of the hot plate.

Comparative Example 4

Indium(III) nitrate trihydrate (0.36 g) (product of Aldrich, 99.999% trace metals basis), zinc nitrate hexahydrate (0.10 g) (product of Aldrich, 99.999% trace metals basis), and 2-aminoethanol (0.05 g) (product of Tokyo Chemical Industry CO., LTD, 99.0%) were added to ultra-pure water (4.50 g), and the mixture was stirred until the mixture became completely transparent, to thereby form an aqueous solution. The solution was employed as a precursor composition R4. The precursor composition R4 was found to have a pH of 2.5. The precursor composition R4 was applied onto an alkali-free glass substrate through spin coating, and the substrate was exposed at room temperature for 30 seconds. The applied precursor composition R4 was dried in air at 150° C. by means of a hot plate for 5 minutes and then fired at 300° C. for 15 minutes by means of the hot plate.

Comparative Example 5

Indium(III) nitrate trihydrate (0.36 g) (product of Aldrich, 99.999% trace metals basis), zinc nitrate hexahydrate (0.10 g) (product of Aldrich, 99.999% trace metals basis), and glycine (0.05 g) (product of Tokyo Chemical Industry CO., LTD, 99.0%) were added to ultra-pure water (4.50 g), and the mixture was stirred until the mixture became completely transparent, to thereby form an aqueous solution. The solution was employed as a precursor composition R5. The precursor composition R5 was found to have a pH of 2.1. The precursor composition R5 was applied onto an alkali-free glass substrate through spin coating, and the substrate was exposed at room temperature for 30 seconds. The applied precursor composition R5 was dried in air at 150° C. by means of a hot plate for 5 minutes and then fired at 300° C. for 15 minutes by means of the hot plate.

Comparative Example 6

The same stacked structure as employed in Example 8 was cleaned by means of a UV ozonizer at 1,500 mJ/cm$^2$. The precursor composition R3 was applied onto the gate insulation film on the substrate through spin coating such that the thickness of the coating after firing was adjusted to 10 nm, dried in air at 150° C. for 5 minutes by means of a hot plate, and fired at 300° C. for 60 minutes by means of the hot plate, to thereby form an amorphous metal oxide semiconductor layer. Thereafter, the same procedure as employed in Example 8 was carried out, to thereby fabricate a thin-film transistor.

Comparative Example 7

The same stacked structure as employed in Example 8 was cleaned by means of a UV ozonizer at 1,500 mJ/cm$^2$. The precursor composition R4 was applied onto the gate insulation film on the substrate through spin coating such that the thickness of the coating after firing was adjusted to 10 nm, dried in air at 150° C. for 5 minutes by means of a hot plate, and fired at 300° C. for 60 minutes by means of the hot plate, to thereby form an amorphous metal oxide semiconductor layer. Thereafter, the same procedure as employed in Example 8 was carried out, to thereby fabricate a thin-film transistor.

Comparative Example 8

The same stacked structure as employed in Example 8 was cleaned by means of a UV ozonizer at 1,500 mJ/cm$^2$. The precursor composition R5 was applied onto the gate insulation film on the substrate through spin coating such that the thickness of the coating after firing was adjusted to 10 nm, dried in air at 150° C. for 5 minutes by means of a hot plate, and fired at 300° C. for 60 minutes by means of the hot plate, to thereby form an amorphous metal oxide semiconductor layer. Thereafter, the same procedure as employed in Example 8 was carried out, to thereby fabricate a thin-film transistor.

Comparative Example 9

The same stacked structure as employed in Example 8 was cleaned by means of a UV ozonizer at 1,500 mJ/cm$^2$. The precursor composition R5 was applied onto the gate insulation film on the substrate through spin coating such that the thickness of the coating after firing was adjusted to 10 nm, dried in air at 150° C. for 5 minutes by means of a hot plate, and fired at 275° C. for 12 hours by means of the hot plate, to thereby form an amorphous metal oxide semiconductor layer. Thereafter, the same procedure as employed in Example 8 was carried out, to thereby fabricate a thin-film transistor.

Comparative Example 10

The same stacked structure as employed in Example 8 was cleaned by means of a UV ozonizer at 1,500 mJ/cm$^2$. The precursor composition R3 was applied onto the gate insulation film on the substrate through spin coating such that the thickness of the coating after firing was adjusted to 10 nm, dried in air at 150° C. for 5 minutes by means of a hot plate, and fired at 250° C. for 24 hours by means of the hot plate, to thereby form an amorphous metal oxide semiconductor layer. Thereafter, the same procedure as employed in Example 8 was carried out, to thereby fabricate a thin-film transistor.

Comparative Example 11

The same stacked structure as employed in Example 8 was cleaned by means of a UV ozonizer at 1,500 mJ/cm$^2$. The precursor composition R4 was applied onto the gate insulation film on the substrate through spin coating such that the thickness of the coating after firing was adjusted to 10 nm, dried in air at 150° C. for 5 minutes by means of a hot plate, and fired at 250° C. for 24 hours by means of the hot plate, to thereby form an amorphous metal oxide semiconductor layer. Thereafter, the same procedure as employed in Example 8 was carried out, to thereby fabricate a thin-film transistor.

Comparative Example 12

The same stacked structure as employed in Example 8 was cleaned by means of a UV ozonizer at 1,500 mJ/cm$^2$. The precursor composition R5 was applied onto the gate insulation film on the substrate through spin coating such that the thickness of the coating after firing was adjusted to 10 nm, dried in air at 150° C. for 5 minutes by means of a hot plate, and fired at 250° C. for 24 hours by means of the hot plate, to thereby form an amorphous metal oxide semiconductor layer. Thereafter, the same procedure as employed in Example 8 was carried out, to thereby fabricate a thin-film transistor.

(Scanning Electron Microscopy Observation)

Figure 5:
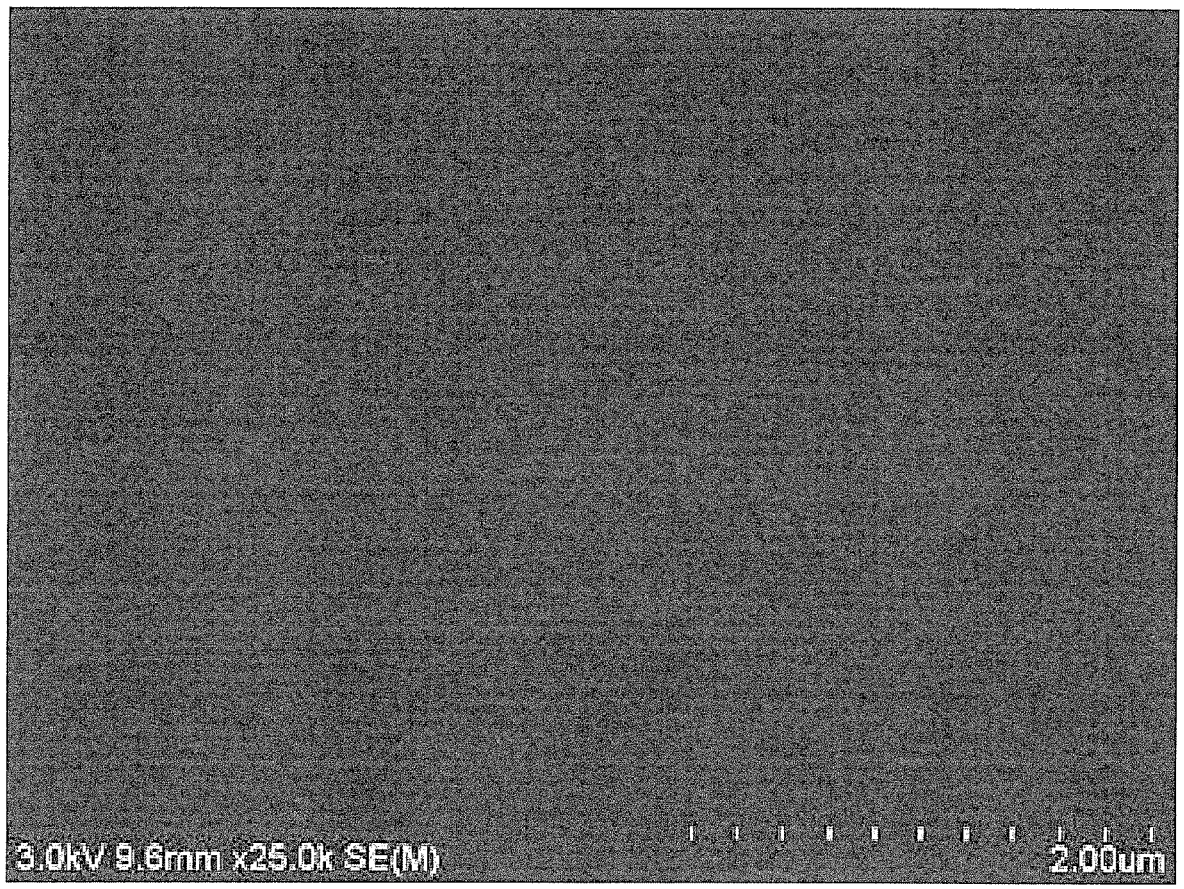
FIG. 5 A scanning electron microscopic image of an amorphous metal oxide layer produced in Example 1.
Figure 6:
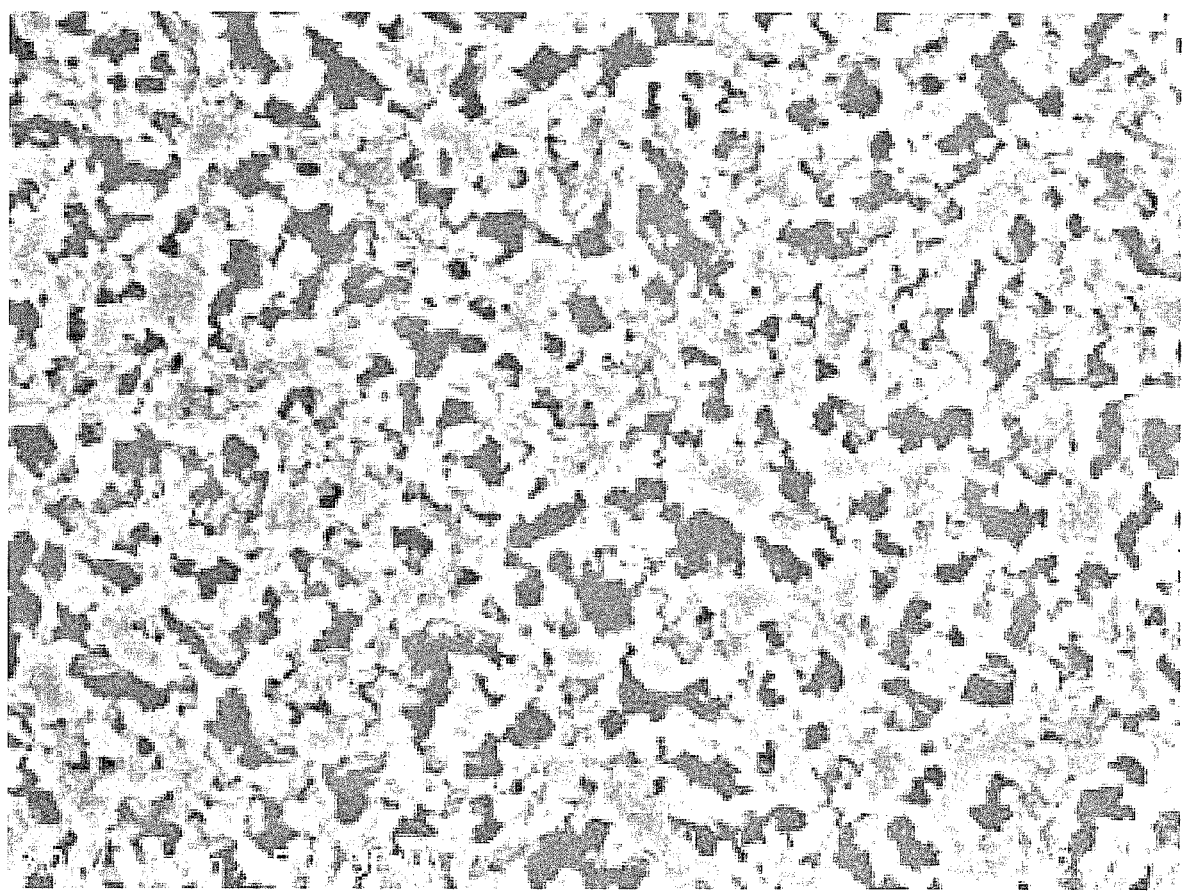
FIG. 6 A scanning electron microscopic image of a metal oxide layer produced in Comparative Example 1.
Figure 7:
FIG. 7 A scanning electron microscopic image of an amorphous metal oxide layer produced in Example 4.

The surface of the metal oxide semiconductor layer formed on the alkali-free glass substrates in each of Examples 1 to 7 and Comparative Examples 1 to 5 was observed under a scanning electron microscope (product of Hitachi High-Technologies Corporation, S4800) at a magnification of 25,000. The results of Example 1, those of Comparative Example 1, and those of Example 4 are shown in FIGS. 5, 6, and 7, respectively. As is clear from FIGS. 5 to 7, each of the metal oxide semiconductor layers formed in Examples 1 to 7 assumed amorphous and its entirety of which has uniform density. In contrast, each of the metal oxide semiconductor layers formed in Comparative Examples 1 and 2 was found to have roughness in the surface and have a density considerably lower than that of the metal oxide semiconductor layers formed in Examples 1 to 7. Whether the film prepared in each of Examples 1 to 7 is amorphous was confirmed by the fact that a halo ring attributed to an amorphous character was observed through electron diffraction (nano-beam electron diffraction). The metal oxide semiconductor layer formed in each of Comparative Examples 1 and 2 was not amorphous, but a crystalline metal oxide semiconductor layer.

(Determination of Lower Limit of Firing Temperature)

Figure 8:
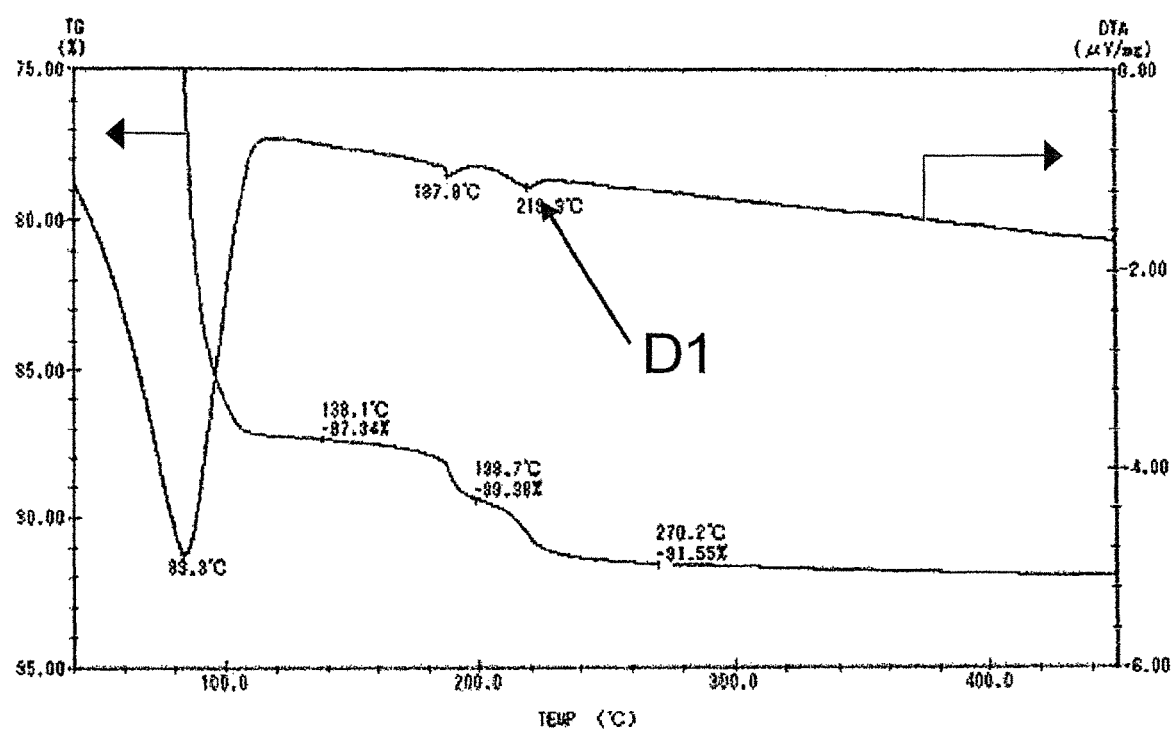
FIG. 8 A TG-DTA curve of a precursor composition 1 prepared in Example 1.

The temperature at which the metal oxide semiconductor layer can be formed in each of Examples 1 to 7 and Comparative Examples 1 to 5 was determined through TG-DTA. Under elevation of the semiconductor layer temperature at a rate of 5° C./minute, a TG-DTA curve was obtained from room temperature to 450° C. by means of a TG-DTA instrument (TG-DTA/MS9610, product of Bruker AXS K.K.). FIG. 8 shows the results of Example 1. As shown in FIG. 8, the last endothermic peak temperature observed in the DTA curve (denoted by D1 in FIG. 8) approximately corresponded to the temperature at which weight loss of the TG curve ended. Therefore, the temperature D1 (° C.) was determined as a "lower limit of firing temperature." Notably, the lower limit of firing temperature is a temperature at which oxidation reaction of the metal salt contained in the precursor composition initiates to thereby form a metal oxide semiconductor layer. The precursor composition in each of Examples 1 to 7 and Comparative Example 1 was found to have a lower limit of firing temperature less than 300° C., specifically 240° C. or less, while the precursor composition in each of Comparative Examples 2 to 5 was found to have a lower limit of firing temperature higher than 300° C.

(Determination for Thin Film Transistor)

Electric characteristics of the thin film transistor produced in each of Examples 8 to 17 and Comparative Examples 6 to 12 were investigated by means of a semiconductor parameter analyzer HP4156C (product of Agilent Technologies, Ltd.) in a shielded case in a reduced pressure ($5\times10^{-2}$ Pa). While the gate bias was swept from −20 V to +20 V, and the drain bias was set to +20 V, the increase in drain current increase (transfer characteristic) was measured. From the obtained data, the mobility ($cm^2/Vs$) and the ON/OFF ratio (LOG value) were calculated. The test of the thin film transistor was carried out in a temperature-controlled room (23° C.±3° C., at a humidity of 40%±10%).

When the gate bias was swept on the plus (positive) side, the thin film transistor produced in each of Examples 8 to 17 and Comparative Example 10 was found to be operated as an n-type semiconductor. Generally, an amorphous metal oxide semiconductor containing gallium exhibits a low mobility. However, the amorphous metal oxide semiconductor formed in Example 12 by use of the precursor composition of the present invention for forming the amorphous metal oxide semiconductor layer was found to have a relatively high mobility, which was satisfactory as a thin film transistor. In contrast, the thin film transistor formed in each of Comparative Examples 6 to 9, 11, and 12 neither showed an n-type enhancement behavior nor was operated as an n-type semiconductor.

TABLE 1

|  | Layer surface density | Lower limit of firing temp. (° C.) |
|---|---|---|
| Ex. 1 | ○ | 220 |
| Ex. 2 | ○ | 240 |
| Ex. 3 | ○ | 220 |
| Ex. 4 | ○ | 220 |
| Ex. 5 | ○ | 220 |
| Ex. 6 | ○ | 240 |
| Ex. 7 | ○ | 240 |
| Comp. Ex. 1 | X | 220 |
| Comp. Ex. 2 | X | 330 |
| Comp. Ex. 3 | ○ | 310 |
| Comp. Ex. 4 | ○ | 330 |
| Comp. Ex. 5 | ○ | 330 |

TABLE 2

|  | Precursor composition | Mobility [$cm^2/Vs$] | ON/OFF ratio [Log value] |
|---|---|---|---|
| Ex. 8 | 1 | 1.30 | 8.9 |
| Ex. 9 | 2 | 5.20 | 8.6 |
| Ex. 10 | 3 | 1.20 | 8.5 |
| Ex. 11 | 6 | 4.20 | 8.4 |
| Ex. 12 | 7 | 0.50 | 7.7 |
| Ex. 13 | 2 | 1.84 | 7.5 |
| Ex. 14 | 6 | 1.84 | 7.7 |
| Ex. 15 | 1 | 0.12 | 6.0 |
| Ex. 16 | 2 | 1.21 | 6.9 |
| Ex. 17 | 6 | 1.00 | 7.4 |
| Comp. Ex. 6 | R3 | — | — |
| Comp. Ex. 7 | R4 | — | — |
| Comp. Ex. 8 | R5 | — | — |
| Comp. Ex. 9 | R5 | — | — |
| Comp. Ex. 10 | R3 | 0.07 | 4.8 |
| Comp. Ex. 11 | R4 | — | — |
| Comp. Ex. 12 | R5 | — | — |

INDUSTRIAL APPLICABILITY

According to the present invention, a uniform and high-density amorphous metal oxide semiconductor layer can be formed through firing at low temperature. Semiconductor devices having the amorphous metal oxide semiconductor layer of the present invention may be employed in variety of fields such as domestic electric appliances, computers, automobiles, and machines.

DESCRIPTION OF THE REFERENCE NUMERALS 1 substrate
2 gate electrode
3 gate insulating film
4 source electrode
5 drain electrode
6 amorphous metal oxide semiconductor layer

The invention claimed is:
1. A precursor composition for forming an amorphous metal oxide semiconductor layer, wherein the composition comprises a metal salt, a primary amide, and a water-based solution;
  wherein the metal salt is at least one inorganic acid salt selected from the group consisting of nitrate salts of In, Sn, Zn, and Ga, wherein the primary amide is at least one species selected from the group consisting of acetamide, acetylurea, acrylamide, adipamide, acetaldehyde, semicarbazone, azodicarbonamide, 4-amino-2,3,5,6-tetrafluorobenzamide, β-alaninamide hydrochloride, L-alaninamide hydrochloride, benzamide, benzylurea, biurea, biuret, butylamide, 3-bromopropionamide, butylurea, 3,5-bis(trifluoromethyl)benzamide, tert-butyl carbamate, hexanamide, ammonium carbamate, ethyl carbamate, 2-chloroacetamide, (2-chloroethyl)urea, crotonamide, 2-cyanoactamide, butyl carbamate, isopropyl carbamate, methyl carbamate, cyanoacetylurea, cyclopropanecarboxamide, cyclohexylurea, 2,2-dichloroacetamide, dicyandiamidine phosphate, guanylurea sulfate, 1,1-dimethylurea, 2,2-dimethoxypropyonamide, ethylurea, fluoroacetamide, formamide, fumaramide, glycinamide hydrochloride, hydroxyurea, hydantoic acid, 2-hydroxyethylurea, heptafluorobutylamide, 2-hydroxyisobutylamide, isobutylamide, lactamide, maleamide, malonamide, 1-methylurea, nitrourea, oxamic acid, ethyl oxamate, oxamide, oxamic hydrazide, butyl oxamate, phenylurea, phthalamide, propionamide, pivalacetamide, pentafluorobenzamide, pentafluoropropionamide, semicarbazide hydrochloride, succinamide, trichloroacetamide, trifluoroacetamide, urea nitrate, and valeramide, wherein the composition contains the primary amide in an amount of 5 to 50 mass % with respect to the amount of the metal salt, wherein the precursor composition is a solution having a pH of 1 to 3, and the at least one inorganic acid salt is selected such that the amorphous metal oxide of the amorphous metal oxide semiconductor layer that is formed upon firing the precursor composition is at least one species selected from the group consisting of indium gallium zinc oxide, indium tin oxide, and indium zinc oxide.

2. The precursor composition for forming an amorphous metal oxide semiconductor layer according to claim 1, wherein the precursor composition has a pH of 2.0 to 2.2.

3. The precursor composition for forming an amorphous metal oxide semiconductor layer of claim 1,
wherein the precursor composition is a transparent solution.

4. A method for producing the amorphous metal oxide semiconductor layer, wherein the method comprises applying a precursor composition for forming an amorphous metal oxide semiconductor layer as recited in claim 1, to thereby form a precursor film, and firing the film at a temperature of 150° C. or higher and lower than 300° C.

5. A precursor composition for forming an amorphous metal oxide semiconductor layer, wherein the composition comprises a metal salt, a primary amide, and a water-based solution;

wherein the metal salt is at least one inorganic acid salt selected from the group consisting of nitrate salts of In, Sn, Zn, and Ga, wherein the primary amide is at least one species selected from the group consisting of acetamide, acetylurea, acrylamide, adipamide, acetaldehyde, semicarbazone, azodicarbonamide, 4-amino-2,3,5,6-tetrafluorobenzamide, β-alaninamide hydrochloride, L-alaninamide hydrochloride, benzamide, benzylurea, biurea, biuret, butylamide, 3-bromopropionamide, butylurea, 3,5-bis(trifluoromethyl)benzamide, tert-butyl carbamate, hexanamide, ammonium carbamate, ethyl carbamate, 2-chloroacetamide, (2-chloroethyl)urea, crotonamide, 2-cyanoactamide, butyl carbamate, isopropyl carbamate, methyl carbamate, cyanoacetylurea, cyclopropanecarboxamide, cyclohexylurea, 2,2-dichloroacetamide, dicyandiamidine phosphate, guanylurea sulfate, 1,1-dimethylurea, 2,2-dimethoxypropyonamide, ethylurea, fluoroacetamide, formamide, fumaramide, glycinamide hydrochloride, hydroxyurea, hydantoic acid, 2-hydroxyethylurea, heptafluorobutylamide, 2-hydroxyisobutylamide, isobutylamide, lactamide, maleamide, malonamide, 1-methylurea, nitrourea, oxamic acid, ethyl oxamate, oxamide, oxamic hydrazide, butyl oxamate, phenylurea, phthalamide, propionamide, pivalacetamide, pentafluorobenzamide, pentafluoropropionamide, semicarbazide hydrochloride, succinamide, trichloroacetamide, trifluoroacetamide, urea nitrate, and valeramide, wherein the composition contains the primary amide in an amount of 5 to 50 mass % with respect to the amount of the metal salt, wherein the precursor composition is a solution having a pH of 1 to 2.2, and the at least one inorganic acid salt is selected such that the amorphous metal oxide of the amorphous metal oxide semiconductor layer that is formed upon firing the precursor composition includes at least one species selected from the group consisting of indium gallium zinc oxide, indium tin oxide, and indium zinc oxide.

6. The precursor composition for forming an amorphous metal oxide semiconductor layer of claim 5, wherein the at least one inorganic acid salt is selected such that the amorphous metal oxide of the amorphous metal oxide semiconductor layer that is formed upon firing the precursor composition is indium tin oxide.

7. The precursor composition for forming an amorphous metal oxide semiconductor layer of claim 5, wherein the at least one inorganic acid salt is selected such that the amorphous metal oxide of the amorphous metal oxide semiconductor layer that is formed upon firing the precursor composition is indium zinc oxide.

8. The precursor composition for forming an amorphous metal oxide semiconductor layer of claim 5, wherein the precursor composition has a pH of 1 to 2.0.

* * * * *